US010483045B2

(12) United States Patent
Kim et al.

(10) Patent No.: US 10,483,045 B2
(45) Date of Patent: Nov. 19, 2019

(54) SOLAR CELL

(71) Applicant: LG CHEM, LTD., Seoul (KR)

(72) Inventors: Seiyong Kim, Daejeon (KR); Mun Kyu Joo, Daejeon (KR); Jong Seok Kim, Daejeon (KR); Junhyuk Jang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 356 days.

(21) Appl. No.: 15/326,228

(22) PCT Filed: Jul. 22, 2015

(86) PCT No.: PCT/KR2015/007648
§ 371 (c)(1),
(2) Date: Jan. 13, 2017

(87) PCT Pub. No.: WO2016/013878
PCT Pub. Date: Jan. 28, 2016

(65) Prior Publication Data
US 2017/0200562 A1      Jul. 13, 2017

(30) Foreign Application Priority Data

Jul. 22, 2014  (KR) .................. 10-2014-0092764

(51) Int. Cl.
*H01G 9/20* (2006.01)
*H01L 51/42* (2006.01)
*H01L 51/00* (2006.01)

(52) U.S. Cl.
CPC ......... *H01G 9/2009* (2013.01); *H01L 51/006* (2013.01); *H01L 51/0046* (2013.01); *H01L 51/0072* (2013.01); *H01L 51/0077* (2013.01); *H01L 51/424* (2013.01); *H01L 51/002* (2013.01); *H01L 51/0058* (2013.01); *Y02E 10/549* (2013.01)

(58) Field of Classification Search
CPC .................. H01L 51/0058; H01L 51/0046
See application file for complete search history.

(56) References Cited

U.S. PATENT DOCUMENTS

| 2007/0089784 A1* | 4/2007 | Noh ................. B82Y 10/00 136/263 |
| 2012/0090685 A1 | 4/2012 | Forrest et al. |
| 2014/0332078 A1* | 11/2014 | Guo .................. H01L 51/424 136/261 |
| 2015/0340632 A1* | 11/2015 | Etgar ................ H01L 51/4226 136/255 |

(Continued)

FOREIGN PATENT DOCUMENTS

| EP | 2846371 A1 * | 3/2015 | .......... H01L 51/442 |
| JP | 2002-094085 A | 3/2002 | |
| KR | 10-2014-0049807 A | 4/2014 | |

(Continued)

OTHER PUBLICATIONS

Jin-Wook Lee et al., "High-efficiency perovskite solar cells based on the black polymorph of HC (NH2)2Pb13", Advanced Materials, Jun. 13, 2014 (e-pub), vol. 26, No. 29, pp. 4991-4998.

*Primary Examiner* — Sadie White
(74) *Attorney, Agent, or Firm* — Dentons US LLP

(57) ABSTRACT

The present specification relates to a solar cell.

14 Claims, 7 Drawing Sheets

(56) References Cited

U.S. PATENT DOCUMENTS

2016/0005547 A1    1/2016    Seok et al.
2016/0149149 A1*    5/2016    Shinotsuka ......... H01L 51/0017
                                                                      136/255

FOREIGN PATENT DOCUMENTS

| KR | 10-2014-0072830 A | 6/2014 | | |
|----|-------------------|--------|---|---|
| KR | 10-2014-0091488 A | 7/2014 | | |
| WO | WO-2014097299 A1 * | 6/2014 | ......... | H01L 51/4226 |
| WO | WO-2014208713 A1 * | 12/2014 | ......... | H01L 51/0017 |

* cited by examiner

[Figure 1]
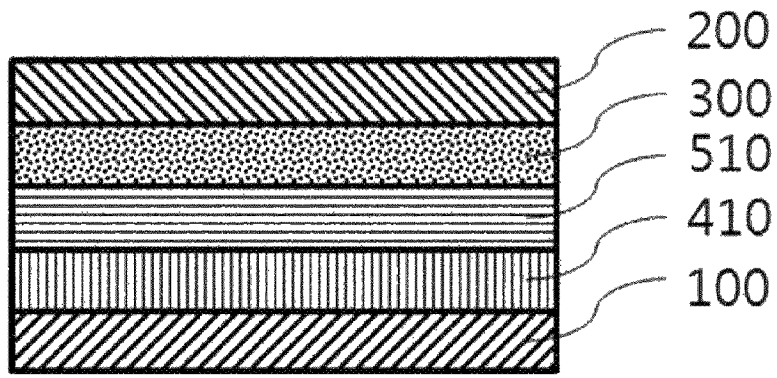
[Figure 2]
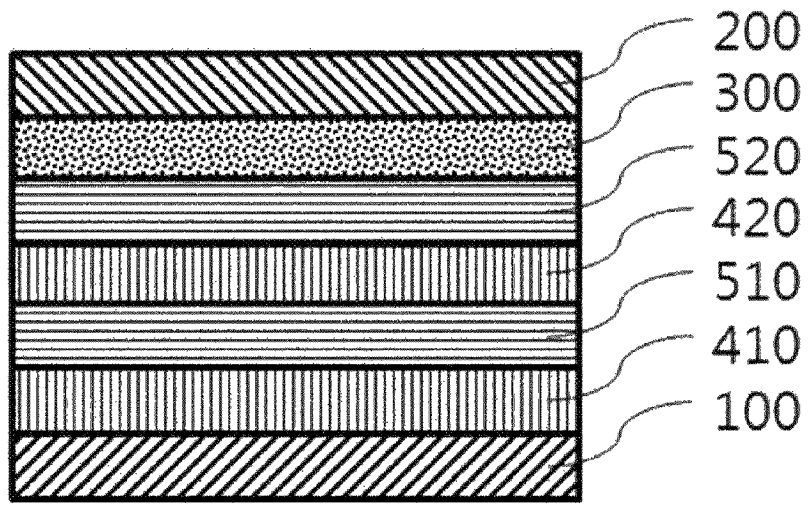

[Figure 3]
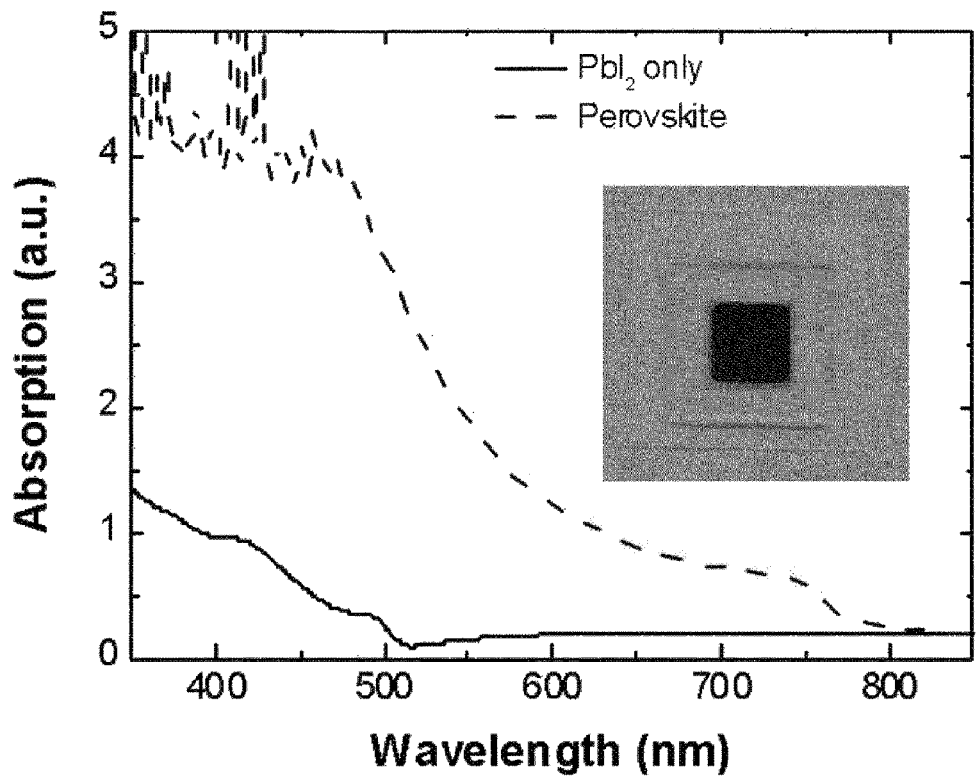
[Figure 4]
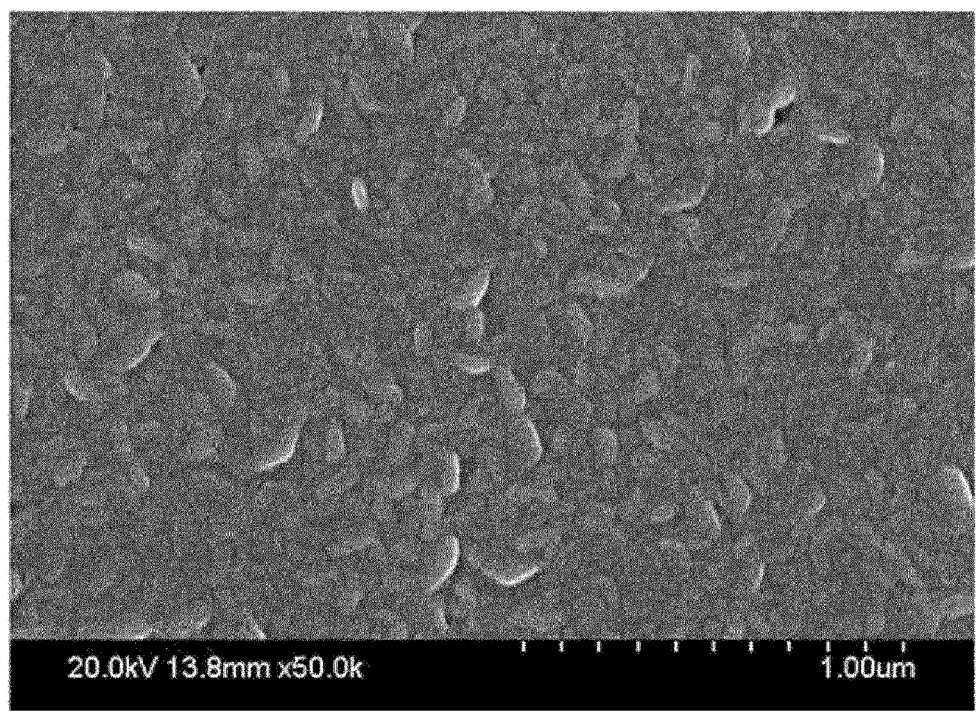

[Figure 5]
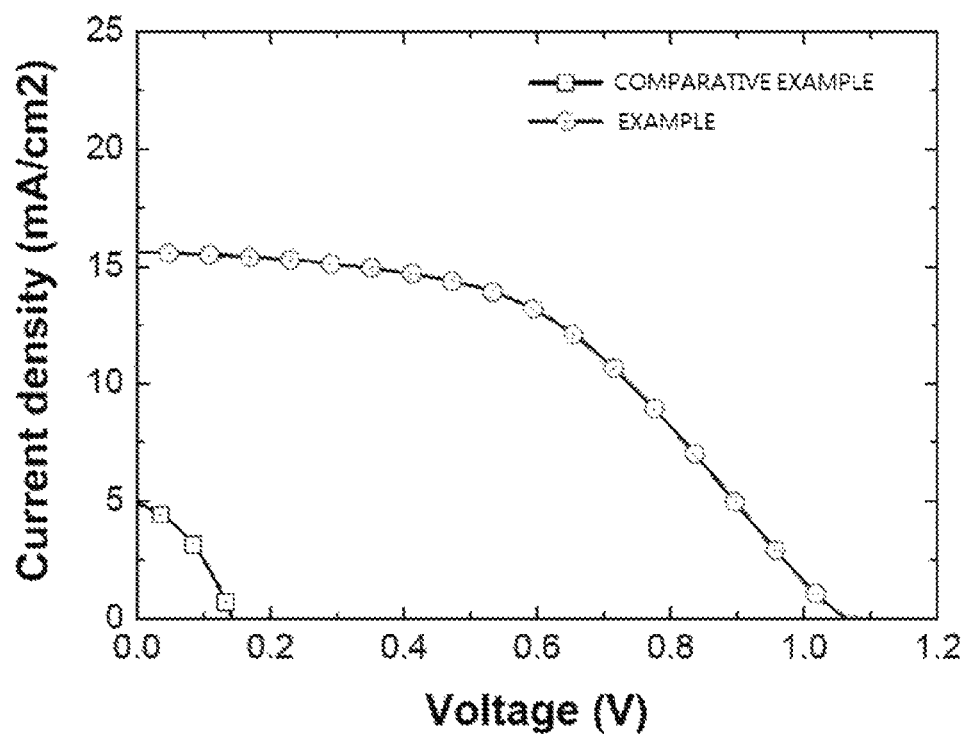

[Figure 6]
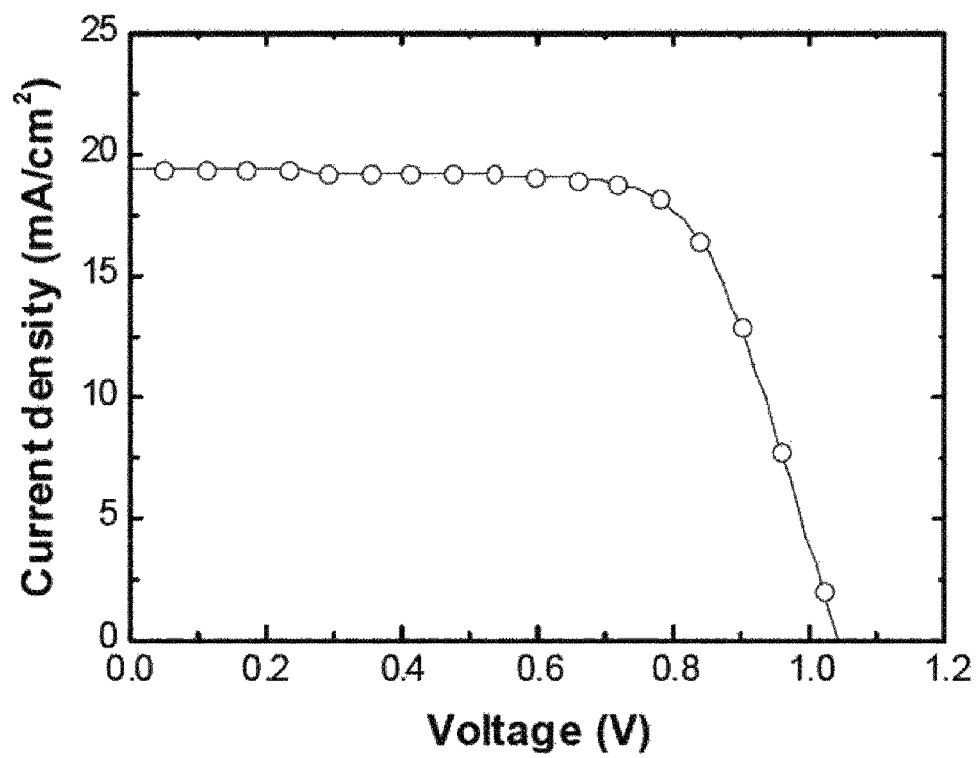

[Figure 7]
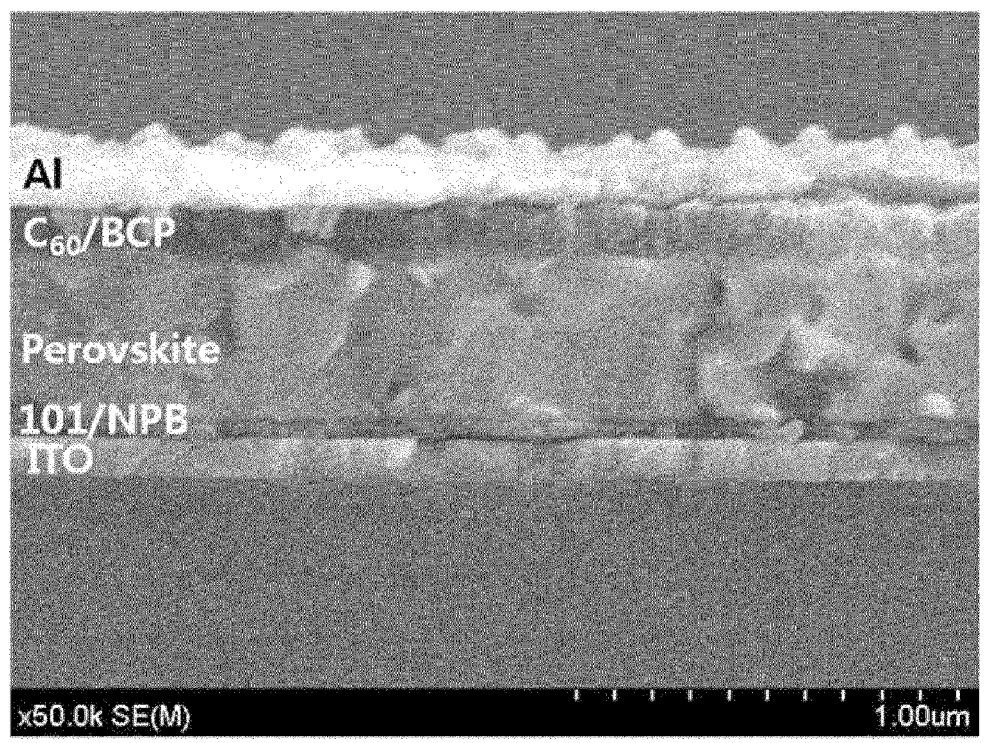

[Figure 8]
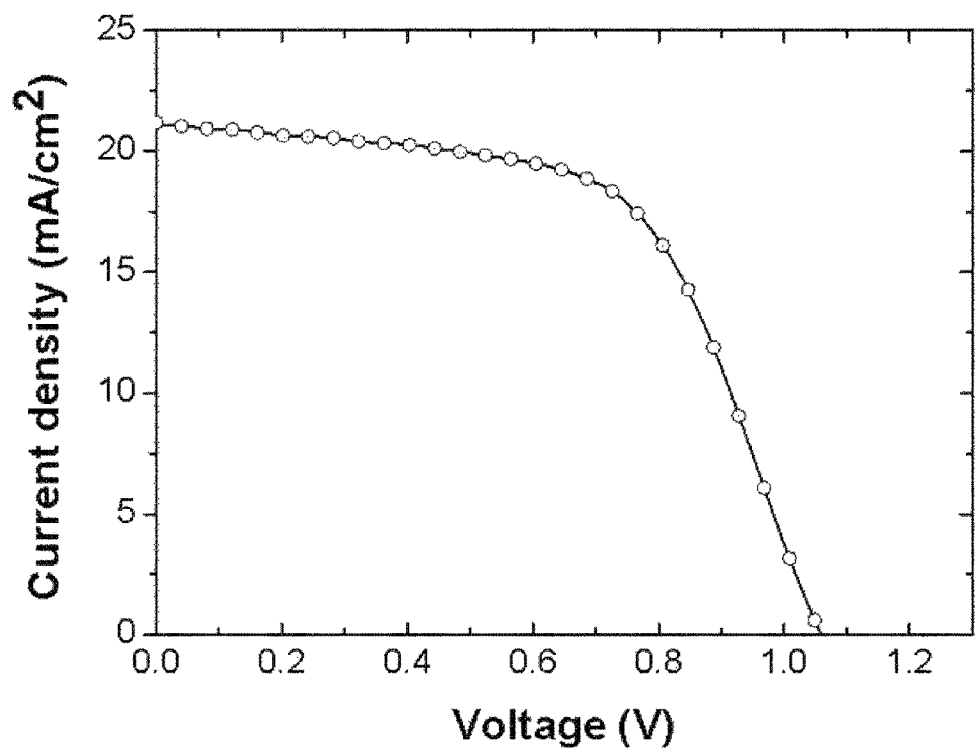

[Figure 9]
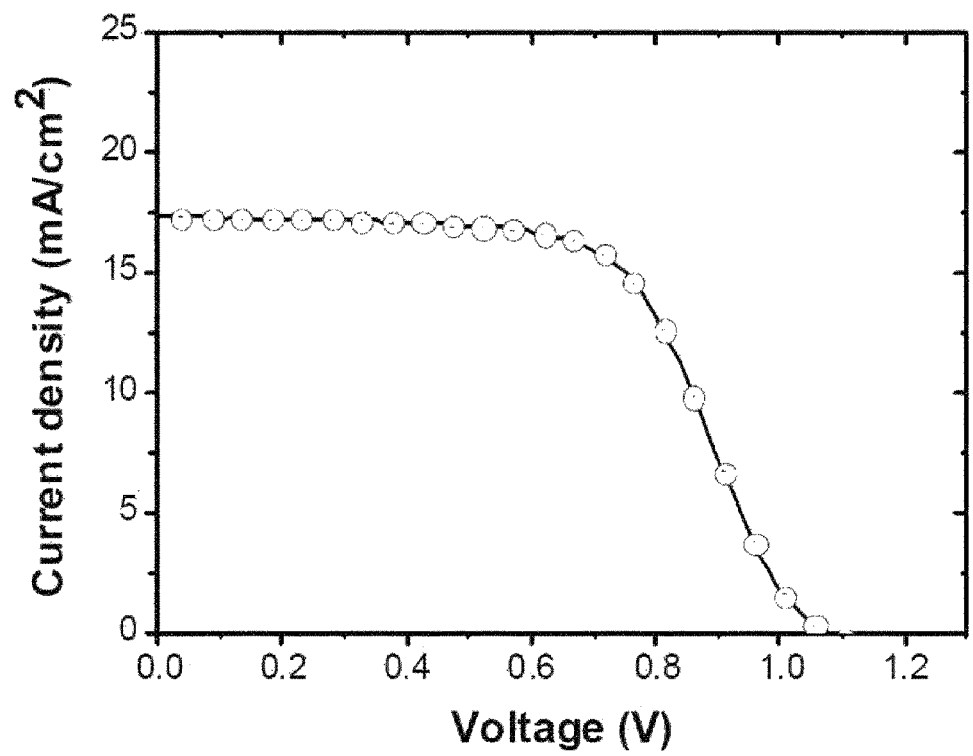

SOLAR CELL

TECHNICAL FIELD

This application is a National Stage Application of International Application No. PCT/KR2015/007648 filed on Jul. 22, 2015, which claims the benefit of KR 10-2014-0092764, filed Jul. 22, 2014, all of which are hereby incorporated by reference in their entirety for all purposes as if fully set forth herein.

The present specification relates to a solar cell.

BACKGROUND ART

In general, a solar cell is a device that converts light energy of the sun into electrical energy. The solar cell is a device that produces electricity using sunlight which is an infinite energy source, a representative solar cell is a silicon solar cell, which is already widely used in daily life, and recently, studies have been conducted on a dye-sensitized solar cell as a next-generation solar cell. The dye-sensitized solar cell is a photo electrochemical solar cell which has higher efficiency and much lower manufacturing cost per unit than the existing silicon solar cell and thus has a possibility of replacing the existing silicon solar cell.

The dye-sensitized solar cell was representatively reported by a research team of Michael Gratzel, et al., at the Swiss National Higher Institute of Technology in Lausanne (Ecole Polytechnique Federale de Lausanne, EPFL) in 1991 (see U.S. Pat. No. 5,350,644 "Photovoltaic cells"). In the structural aspect, one of two electrodes of the dye-sensitized solar cell is a photoelectrode including a transparent conductive substrate on which a semiconductor layer, on which a photosensitive dye is adsorbed, is formed, and a space between the two electrodes is filled with an electrolyte.

Below, the operating principle of the dye-sensitized solar cell is based on when solar energy is absorbed into a photosensitive dye adsorbed on a semiconductor layer of an electrode to generate photoelectrons, the photoelectrons are conducted through the semiconductor layer, and thus are transferred to a conductive transparent substrate in which a transparent electrode is formed, and the dye, which has lost electrons and thus is oxidized, is reduced by an oxidation•reduction pair included in the electrolyte. Meanwhile, the electrons, which reach a counter electrode, which is an opposite electrode, through an external electric wire, again reduce the oxidation•reduction pair of the oxidized electrolyte to complete the operation process of the solar cell.

Meanwhile, the dye-sensitized solar cell includes various interfaces such as an interface between a semiconductor and a dye, an interface between a semiconductor and an electrolyte, an interface between a semiconductor and a transparent electrode, and an interface between an electrolyte and a counter electrode, as compared to the existing solar cells, and it is an implemental key to the dye-sensitized solar cell technology to understand and control the physical•chemical actions at each interface. Further, the energy conversion efficiency of the dye-sensitized solar cell is proportional to the amount of photoelectrons produced by the solar energy absorption, and in order to produce a large amount of photoelectrons, it is required to manufacture a photoelectrode including a structure which may increase the amount of dye molecules adsorbed.

Meanwhile, an electrolyte used for the dye-sensitized solar cell may be classified into a liquid electrolyte, a gel-type electrolyte, and a solid electrolyte depending on the properties thereof. When a solar cell is manufactured by using a liquid electrolyte, there is an advantage in that the energy conversion efficiency is increased, whereas there is a disadvantage in that a solvent included in the liquid electrolyte may leak or be volatilized depending on an increase in external temperature or the sealing state of the solar cell, thereby reducing the lifetime of the solar cell. In contrast, when a solar cell is manufactured by using a solid electrolyte, leakage or volatilization problems of the electrolyte do not occur, but there is a disadvantage in that the energy conversion efficiency generally decreases, thereby resulting in difficulty in solar cell application. Thus, there has been a need for developing a novel electrolyte or developing and applying a novel material, which may replace an electrolyte, to solve the above-described disadvantages.

In general, a ruthenium (Ru) metal complex has been widely used as a dye used for the dye-sensitized solar cell, but the ruthenium metal complex has a disadvantage in that the ruthenium metal complex is highly expensive and is difficult to purify. Further, it takes a long adsorption time from at least 2 hours up to 24 hours for an organic dye including ruthenium metal to be adsorbed onto a semiconductor layer, and thus there is a disadvantage in that the time taken for the manufacturing process is increased, and there is a limitation in that high energy conversion efficiency is achieved only when a thickness of the semiconductor layer is at least about 10 μm. Thus, there have been attempts to use a dye other than the ruthenium metal complex, but even in these cases, energy conversion efficiency of only a maximum of about 3% is achieved when the thickness of the semiconductor layer is around 10 μm, and there is a problem in that high energy conversion efficiency is not achieved when the thickness of the semiconductor layer is thinner than 10 μm.

DETAILED DESCRIPTION OF THE INVENTION

Technical Problem

The present specification has been made in an effort to provide a solar cell.

Technical Solution

An exemplary embodiment of the present specification provides a solar cell including: an anode; a cathode provided to face the anode; and a photoactive layer including a compound having a perovskite structure provided between the anode and the cathode, in which at least one first organic material layer and at least one second organic material layer are alternately provided between the anode and the photoactive layer, the first organic material layer includes a compound represented by the following Chemical Formula 1, and the second organic material layer includes a hole transporting material having a HOMO energy level of −5 eV or less.

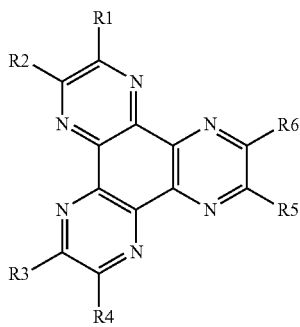

[Chemical Formula 1]

In Chemical Formula 1,

R1 to R6 are each independently selected from the group consisting of hydrogen; a halogen group; a nitrile group; a nitro group; a sulfonyl group; a sulfoxide group; a sulfonamide group; a sulfonate group; a trifluoromethyl group; an ester group; an amide group; a substituted or unsubstituted straight- or branch-chained C1 to C12 alkoxy group; a substituted or unsubstituted straight- or branch-chained C1 to C12 alkyl group; substituted or unsubstituted straight- or branch-chained C2 to C12 alkenyl group; a substituted or unsubstituted aromatic or non-aromatic hetero-cyclic group; a substituted or unsubstituted aryl group; a substituted or unsubstituted mono- or di-arylamine group; and a substituted or unsubstituted aralkylamine group.

Advantageous Effects

The solar cell according to an exemplary embodiment of the present specification exhibits excellent photoelectric conversion efficiency.

The solar cell according to an exemplary embodiment of the present specification has excellent electron movement due to the organic material layer including the compound represented by Chemical Formula 1 and thus exhibits high efficiency.

According to the solar cell according to an exemplary embodiment of the present specification, there is an advantage in that electrons in an excited state due to light absorption may smoothly move up to electrodes.

According to the solar cell according to an exemplary embodiment of the present specification, when a photoactive layer is formed by using a compound having a perovskite structure, defective parts such as pinholes are minimized and photoactivity is formed, thereby implementing excellent performance.

According to the solar cell according to an exemplary embodiment of the present specification, electrons injected from an anode may easily recombine with holes formed in a photoactive layer to achieve high efficiency.

BRIEF DESCRIPTION OF DRAWINGS

FIGS. 1 and 2 illustrate a stacking structure of a solar cell according to an exemplary embodiment of the present specification.

FIG. 3 illustrates light absorption according to a wavelength of a photoactive layer formed as in Example 1 and an exterior photograph of a device manufactured according to Example 1.

FIG. 4 illustrates a scanning electron microscope (SEM) image of the surface of the photoactive layer manufactured as in Example 1.

FIG. 5 illustrates the results of measuring the voltage-current density of a solar cell manufactured according to Example 2-1 and a solar cell manufactured according to Comparative Example 1.

FIG. 6 illustrates the results of measuring the voltage-current density of a solar cell manufactured according to Example 2-2.

FIG. 7 illustrates a scanning electron microscope (SEM) image of the cross-section of the solar cell in Example 2-2.

FIG. 8 illustrates the results of measuring the voltage-current density of a solar cell manufactured according to Example 2-3.

FIG. 9 illustrates the results of measuring the voltage-current density of a solar cell manufactured according to Example 2-4.

BEST MODE

When one member is disposed "on" another member in the present specification, this includes not only a case where the one member is brought into contact with the another member, but also a case where still another member is present between the two members.

When one part "includes" one constituent element in the present specification, unless otherwise specifically described, this does not mean that another constituent element is excluded, but means that another constituent element may be further included.

Hereinafter, the present specification will be described in more detail.

An exemplary embodiment of the present specification provides a solar cell including: an anode; a cathode provided to face the anode; and a photoactive layer including a compound having a perovskite structure provided between the anode and the cathode, in which at least one first organic material layer and at least one second organic material layer are alternately provided between the anode and the photoactive layer, the first organic material layer includes a compound represented by the following Chemical Formula 1, and the second organic material layer includes a hole transporting material having a HOMO energy level of −5 eV or less.

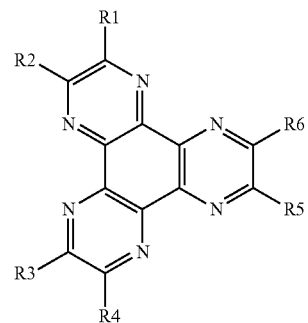

[Chemical Formula 1]

In Chemical Formula 1,

R1 to R6 are each independently selected from the group consisting of hydrogen; a halogen group; a nitrile group (—CN); a nitro group (—NO$_2$); a sulfonyl group (—SO$_2$R); a sulfoxide group (—SOR); a sulfonamide group (—SO$_2$NR$_2$); a sulfonate group (—SO$_3$R); a trifluoromethyl group (—CF$_3$); an ester group (—COOR); an amide group (—CONHR or —CONRR'); a substituted or unsubstituted straight- or branch-chained C1 to C12 alkoxy group; a substituted or unsubstituted straight- or branch-chained C1 to C12 alkyl group; substituted or unsubstituted straight- or branch-chained C2 to C12 alkenyl group; a substituted or unsubstituted aromatic or non-aromatic hetero-cyclic group;

a substituted or unsubstituted aryl group; a substituted or unsubstituted mono- or di-arylamine group; and a substituted or unsubstituted aralkylamine group, and R and R' are selected from the group consisting of a substituted or unsubstituted C1 to C60 alkyl group; a substituted or unsubstituted aryl group; and a substituted or unsubstituted 5- to 7-membered hetero-cyclic group.

According to an exemplary embodiment of the present specification, the first organic material layer may be formed by using the material represented by Chemical Formula 1. Specifically, according to an exemplary embodiment of the present specification, the first organic material layer may be formed by including the compound represented by Chemical Formula 1 as a main material. Further, according to an exemplary embodiment of the present specification, the first organic material layer may further include additional materials or impurities in addition to the compound represented by Chemical Formula 1.

The first organic material layer may serve to efficiently transfer electrons from the anode to the second organic material layer. In addition, the first organic material layer may serve to allow the compound having a perovskite structure, which constitutes the photoactive layer, to be uniformly formed.

According to an exemplary embodiment of the present specification, any one of the first organic material layers may be provided to be directly brought into contact with the anode. Specifically, the first organic material layer provided to be directly brought into contact with the anode may be an anode buffer layer.

According to an exemplary embodiment of the present specification, the second organic material layer may be formed by using the hole transporting material having a HOMO energy level of −5 eV or less. Specifically, according to an exemplary embodiment of the present specification, the second organic material layer may be formed by including the hole transporting material as a main material. Furthermore, according to an exemplary embodiment of the present specification, the second organic material layer may further include additional materials or impurities in addition to the hole transporting material.

According to an exemplary embodiment of the present specification, the second organic material layer may have a HOMO energy level of −5 eV or less.

The second organic material layer may serve to prevent electrons produced from the photoactive layer from moving to the first organic material layer. Specifically, when the second organic material layer is not provided, electrons formed in the photoactive layer move to the interface between the photoactive layer and the first organic material layer to inhibit recombination of holes formed in the photoactive layer with electrons injected from the anode, thereby reducing the efficiency of the solar cell. That is, the second organic material layer may serve to block electrons formed in the photoactive layer from interrupting a normal hole extracting path.

When the second organic material layer has a HOMO energy level of −5 eV or less, electrons formed in the photoactive layer may be blocked, and electrons injected from the anode may be allowed to smoothly move.

Furthermore, the second organic material layer does not interrupt the role of the first organic material layer which may allow the compound having a perovskite structure to be uniformly formed. Specifically, even though the second organic material layer is provided on the first organic material layer, the compound having a perovskite structure may be uniformly formed.

According to an exemplary embodiment of the present specification, any one of the second organic material layers may be provided to be directly brought into contact with the photoactive layer.

In the present specification, the term "provided to be directly brought into contact with" means that two members are provided to be physically brought into contact with each other.

According to an exemplary embodiment of the present specification, the first organic material layer and the second organic material may be sequentially provided between the anode and the photoactive layer. An example of the solar cell having the structure as described above is illustrated in FIG. 1. Specifically, FIG. 1 illustrates that a first organic material layer 410 and a second organic material layer 510 are sequentially provided between an anode 100 and a photoactive layer 300, and a cathode 200 is provided on the photoactive layer 300. The solar cell according to an exemplary embodiment of the present specification is not limited to the stacking structure in FIG. 1, and an additional layer such as a cathode buffer layer may be further included.

According to an exemplary embodiment of the present specification, the first organic material layer, the second organic material layer, the first organic material layer, and the second organic material layer may be sequentially provided between the anode and the photoactive layer. An example of the solar cell having the structure as described above is illustrated in FIG. 2. Specifically, FIG. 2 illustrates that the first organic material layer 410, the second organic material layer 510, a first organic material layer 420, and a second organic material layer 520 are sequentially provided between the anode 100 and the photoactive layer 300, and the cathode 200 is provided on the photoactive layer 300. The solar cell according to an exemplary embodiment of the present specification is not limited to the stacking structure in FIG. 2, and an additional layer such as a cathode buffer layer may be further included.

According to an exemplary embodiment of the present specification, a difference between the LUMO energy level of the compound represented by Chemical Formula 1 and the HOMO energy level of the hole transporting material may be 0.5 eV or less. Specifically, according to an exemplary embodiment of the present specification, a difference between the LUMO energy level of the compound represented by Chemical Formula 1 and the HOMO energy level of the hole transporting material may be 0.2 eV or less.

According to an exemplary embodiment of the present specification, a difference between the LUMO energy level of the first organic material layer and the HOMO energy level of the second organic material layer may be 0.5 eV or less. Specifically, according to an exemplary embodiment of the present specification, a difference between the LUMO energy level of the first organic material layer and the HOMO energy level of the second organic material layer may be 0.2 eV or less.

According to the solar cell according to an exemplary embodiment of the present specification, a built-in potential is formed through the band bending at the HOMO of the hole transporting material of the second organic material layer, thereby making holes be smoothly extracted. When the difference between the LUMO energy level of the compound represented by Chemical Formula 1 and the HOMO energy level of the hole transporting material is 0.5 eV or less, holes are smoothly extracted, thereby contributing to enhancing performance of the solar cell. When the difference between the LUMO energy level of the compound represented by Chemical Formula 1 and the HOMO energy level of the hole transporting material exceeds 0.5 eV, there is a problem in that holes are not smoothly extracted because the band bending phenomenon at the HOMO of the hole transporting material of the second organic material layer is not smoothly formed.

According to an exemplary embodiment of the present specification, the at least one second organic material layer may further include a material having a work function of 4.5 eV or less.

According to an exemplary embodiment of the present specification, the material having a work function of 4.5 eV or less may be a metal halide. Specifically, according to an exemplary embodiment of the present specification, the material having a work function of 4.5 eV or less may be a metal halide such as CuI.

The material having a work function of 4.5 eV or less may act as a p-type dopant in the second organic material layer. Specifically, when the material having a work function of 4.5 eV or less is further included in the second organic material layer, the hole density may be increased, thereby enhancing the hole mobility. Further, when the material having a work function of 4.5 eV or less is further included in the second organic material layer, the band bending phenomenon may be effectively generated at the HOMO of the hole transporting material of the second organic material layer.

According to an exemplary embodiment of the present specification, all of R1 to R6 of Chemical Formula 1 may be a nitrile group (—CN).

In addition, according to an exemplary embodiment of the present specification, the compound represented by Chemical Formula 1 may be any one of the following Chemical Formulae 1-1 to 1-6.

[Chemical Formula 1-1]

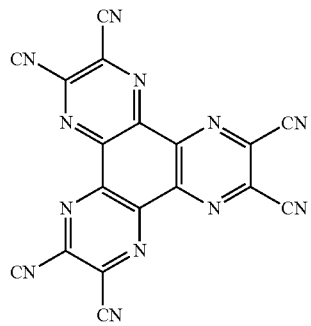

[Chemical Formula 1-2]

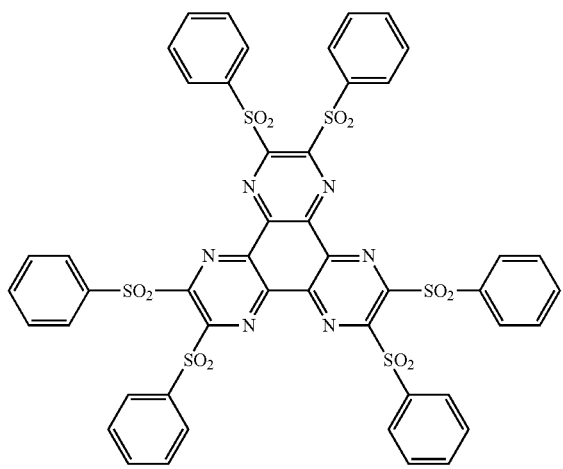

[Chemical Formula 1-3]

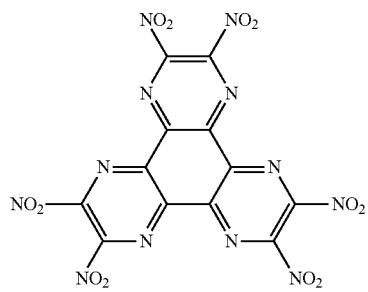

[Chemical Formula 1-4]

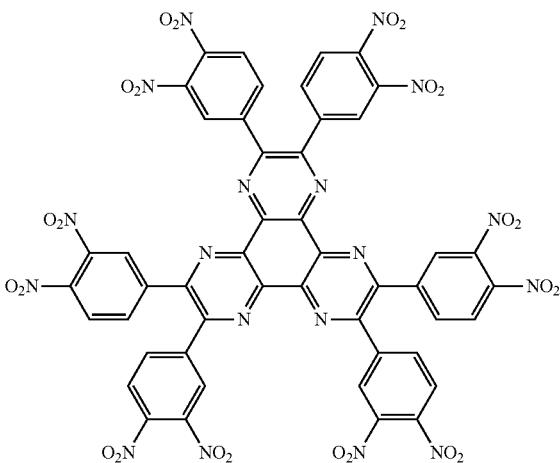

[Chemical Formula 1-5]

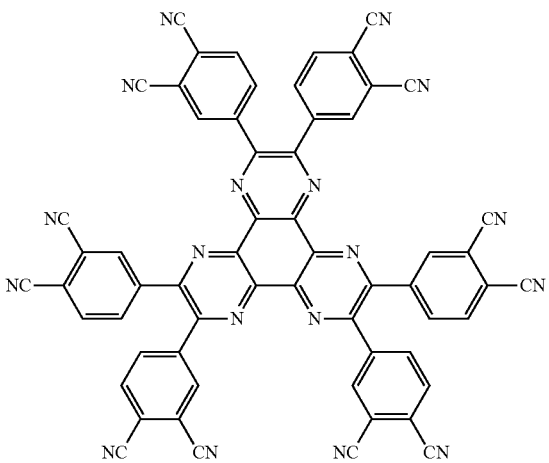

[Chemical Formula 1-6]

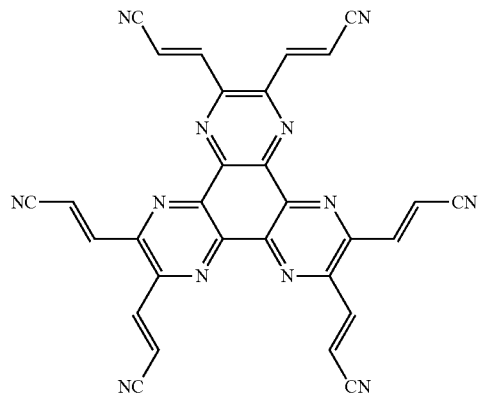

According to an exemplary embodiment of the present specification, the material having a HOMO energy level of −5 eV or less may be a compound represented by the following Chemical Formula A.

[Chemical Formula A]

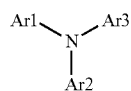

In Chemical Formula A, Ar1, Ar2, and Ar3 are each independently hydrogen or a substituted or unsubstituted hydrocarbon group. In this case, at least one of Ar1, Ar2, and Ar3 may include an aromatic hydrocarbon substituent, and the substituents may be the same as each other and may be composed of different substituents. Among Ar1, Ar2, and Ar3, those, which are not an aromatic hydrocarbon, may be hydrogen; a straight-chained, branch-chained, or cyclic aliphatic hydrocarbon; or a substituted or unsubstituted heterocyclic group including N, O, S, or Se.

According to an exemplary embodiment of the present specification, the material having a HOMO energy level of −5 eV or less may be the following compounds, but is not limited thereto.

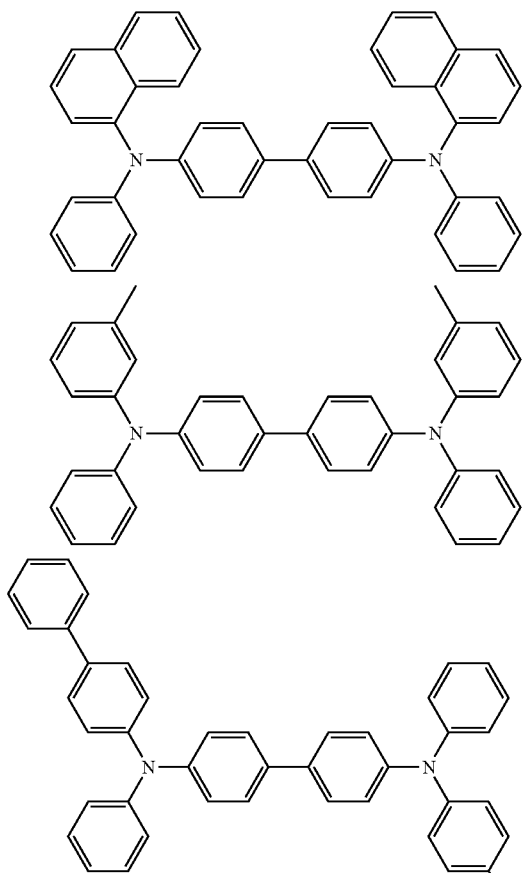

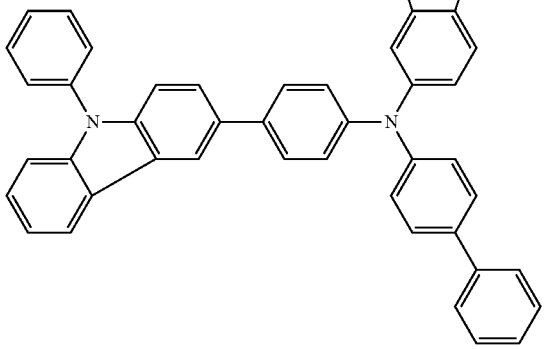

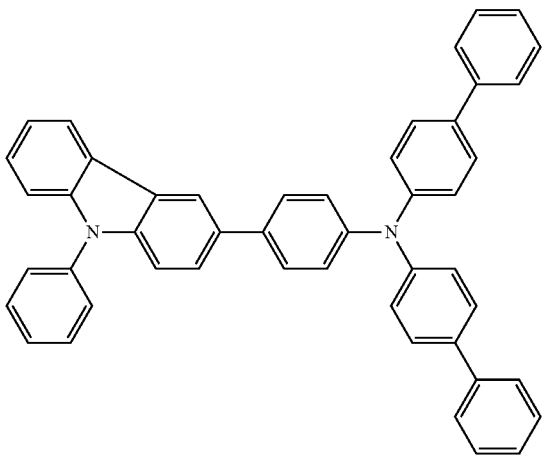

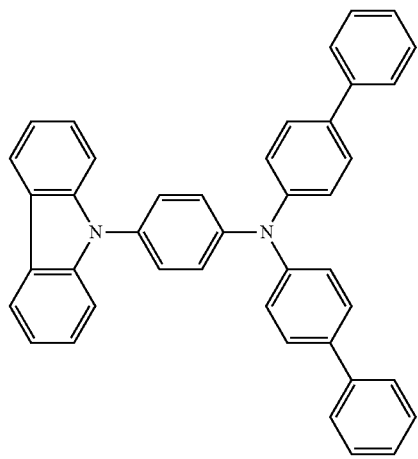

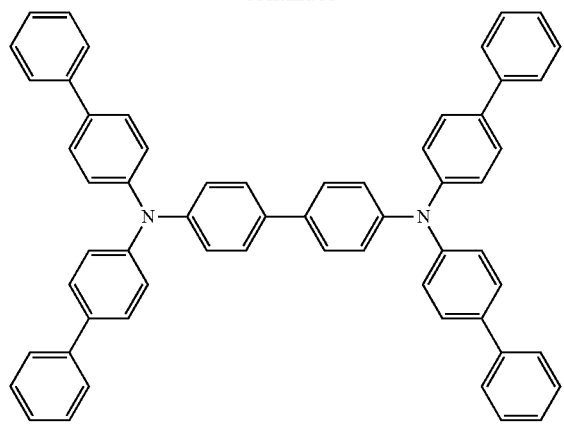
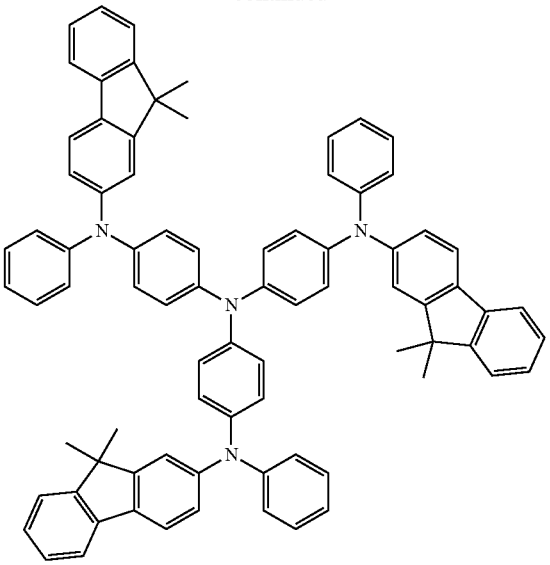
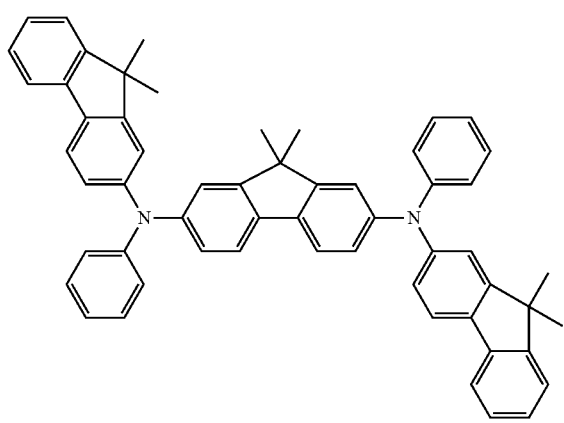
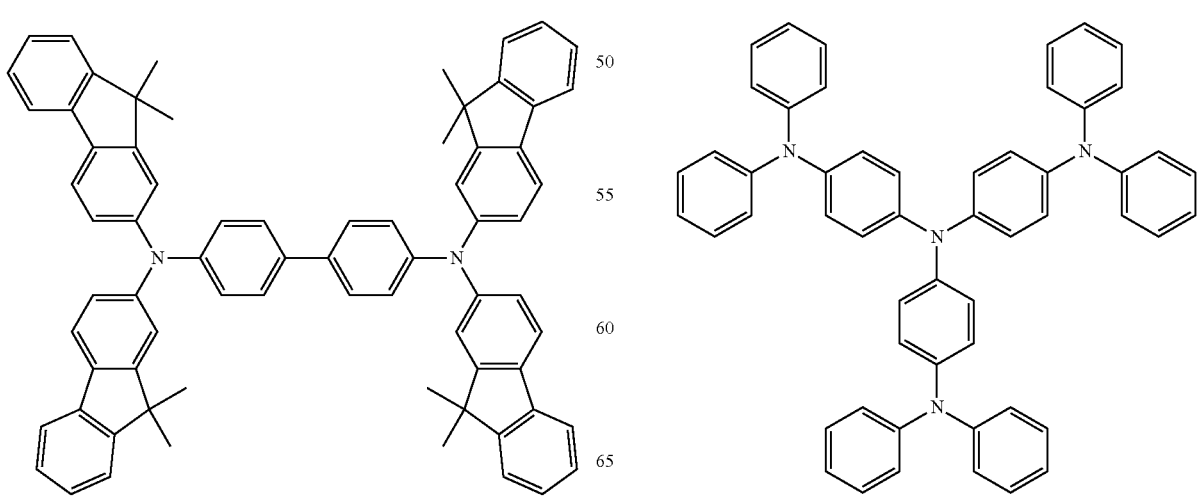

13
-continued
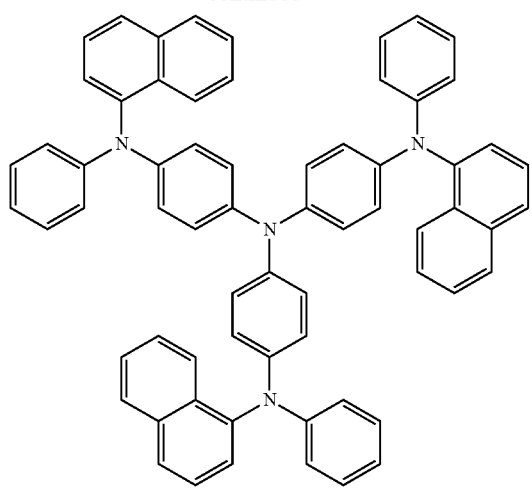
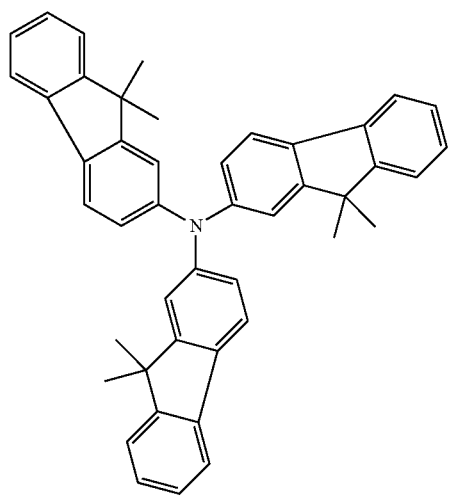
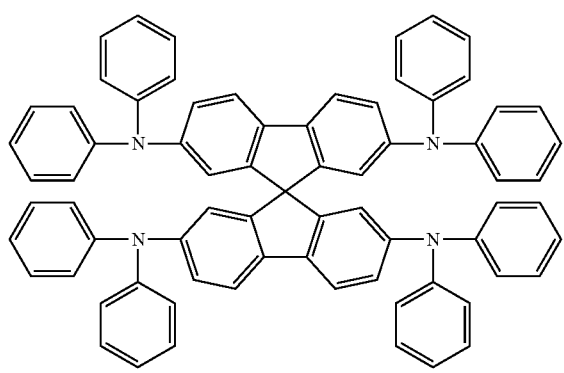
14
-continued
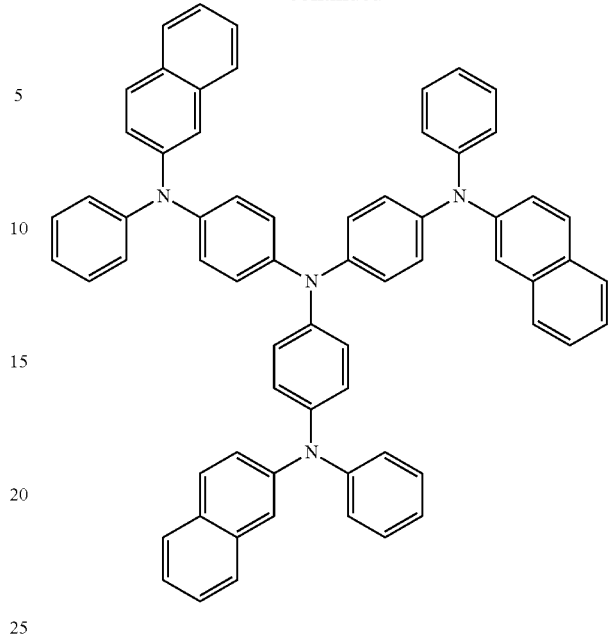
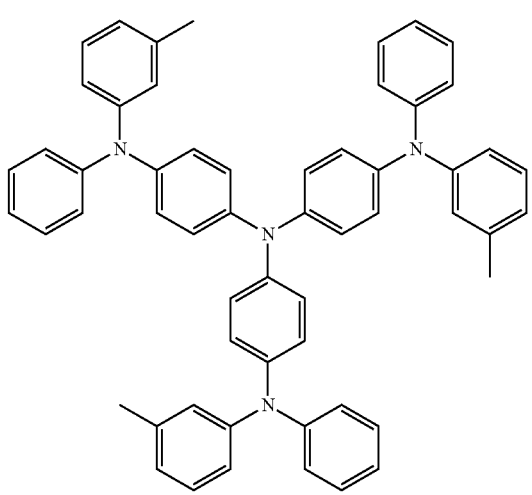
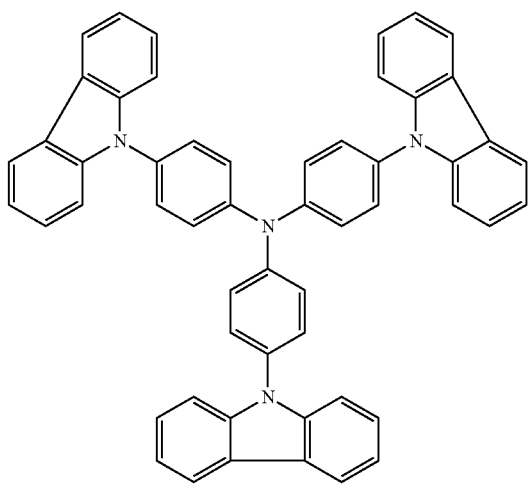

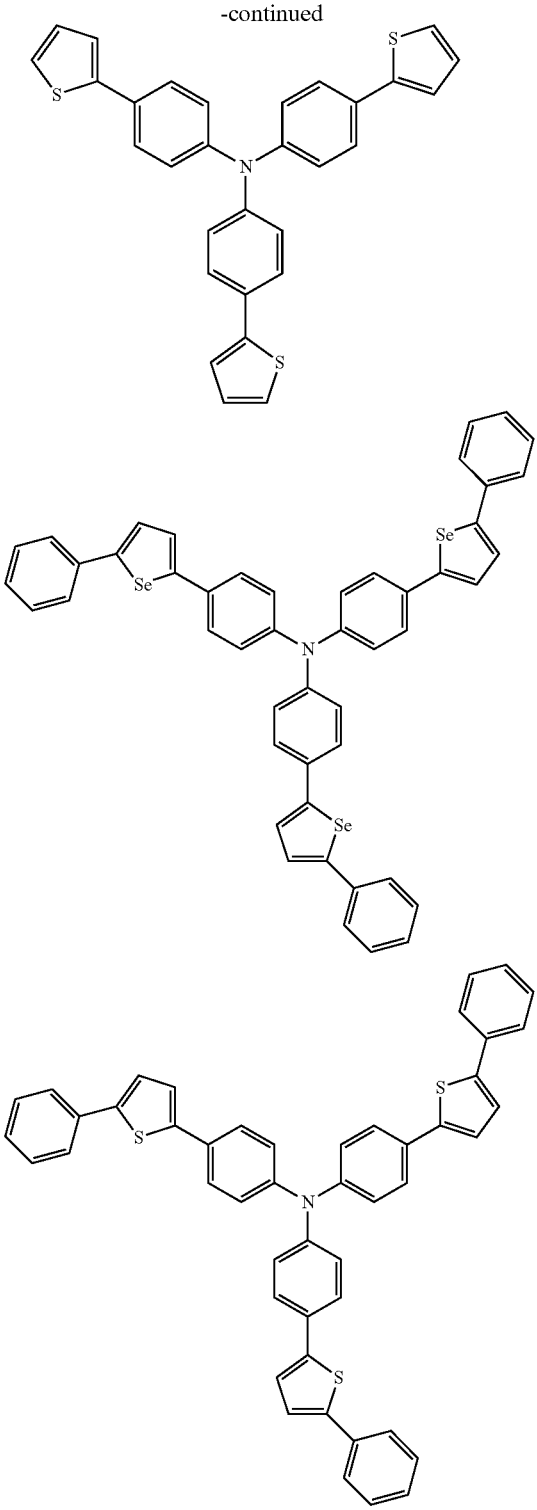

When the first organic material layer has a thickness of 1 nm or more, the first organic material layer may be operated in a solar cell. Specifically, when the first organic material layer has a thickness of 5 nm or more, a more appropriate layer is formed, and the performance of the solar cell may be enhanced.

According to an exemplary embodiment of the present specification, the second organic material layer may have a thickness of 5 nm to 100 nm. Specifically, according to an exemplary embodiment of the present specification, the second organic material layer may have a thickness of 5 nm to 50 nm. More specifically, according to an exemplary embodiment of the present specification, the second organic material layer may have a thickness of 5 nm to 20 nm.

According to an exemplary embodiment of the present specification, one or more electron transporting layers may be further provided between the cathode and the photoactive layer.

According to an exemplary embodiment of the present specification, a metal compound layer including a metal compound may be further included between the cathode and the photoactive layer. Specifically, according to an exemplary embodiment of the present specification, a metal oxide layer provided between the cathode and the photoactive layer may include $TiO_2$ and/or $ZnO_2$.

According to an exemplary embodiment of the present specification, the compound having a perovskite structure may satisfy the following Structural Formula 1-1.

$$A\ B_{(1-y)}B'_{y}X_{(3-z)}X'_{z} \qquad \text{[Structural Formula 1-1]}$$

A is a substituted or unsubstituted monovalent nitrogen ion, a substituted or unsubstituted monovalent carbon ion, and an alkali metal ion or alkaline earth metal ion, B and B' are each independently a positive ion of a transition metal, and X and X' are each independently a negative ion of an element selected from the group selected as Groups XVI and XVII, $0 \leq y \leq 1$, and $0 \leq z \leq 3$.

According to an exemplary embodiment of the present specification, the positive ion of the transition metal may be a positive ion derived from Pb, Sn, Ti, Nb, Zr, or Ce. According to an exemplary embodiment of the present specification, A may be a monovalent ion represented by the following Chemical Formula 2-1.

$$[A'_{p}A''_{(1-p)}]^{+} \qquad \text{[Chemical Formula 2-1]}$$

A' and A'' are each independently $Li^+$, $Na^+$, $K^+$, $Rb^+$, $Cs^+$, $Be^{2+}$, $Ca^{2+}$, $Sr^{2+}$, or $Ba^{2+}$, and $0 \leq p \leq 1$.

According to an exemplary embodiment of the present specification, A may be a monovalent ion represented by the following Chemical Formula 2-2.

[Chemical Formula 2-2]

$$R11-\underset{\underset{R14}{|}}{\overset{\overset{R12\ \ R13}{\diagdown\ /}}{N^+}}$$

In Chemical Formula 2-2,

R11 is a substituted or unsubstituted alkyl group having 1 to 20 carbon atoms, a substituted or unsubstituted cycloalkyl group having 3 to 20 carbon atoms, or a substituted or unsubstituted aryl group having 6 to 20 carbon atoms, and R12 to R14 are each independently hydrogen, a substituted or unsubstituted alkyl group having 1 to 20 carbon atoms, a substituted or unsubstituted cycloalkyl group hav- According to an exemplary embodiment of the present specification, the first organic material layer may have a thickness of 1 nm to 100 nm. Specifically, according to an exemplary embodiment of the present specification, the first organic material layer may have a thickness of 5 nm to 50 nm. More specifically, according to an exemplary embodiment of the present specification, the first organic material layer may have a thickness of 5 nm to 30 nm.

ing 3 to 20 carbon atoms, or a substituted or unsubstituted aryl group having 6 to 20 carbon atoms.

According to an exemplary embodiment of the present specification, A may be a monovalent ion represented by the following Chemical Formula 2-3.

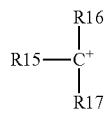

[Chemical Formula 2-3]

In Chemical Formula 2-3,

R15 and R16 are a substituted or unsubstituted alkyl group having 1 to 20 carbon atoms, a substituted or unsubstituted cycloalkyl group having 3 to 20 carbon atoms, a substituted or unsubstituted aryl group having 6 to 20 carbon atoms, or NR'R", and R' and R" are each independently hydrogen, a substituted or unsubstituted alkyl group having 1 to 20 carbon atoms, or a substituted or unsubstituted alkoxy group having 1 to 20 carbon atoms.

According to an exemplary embodiment of the present specification, the compound having a perovskite structure may satisfy any one of the following Structural Formulae 2-1 to 2-6.

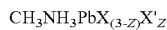  [Structural Formula 2-1]

$CH_3NH_3PbX_{(3-Z)}X'_Z$

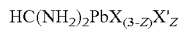  [Structural Formula 2-2]

$HC(NH_2)_2PbX_{(3-Z)}X'_Z$

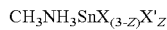  [Structural Formula 2-3]

$CH_3NH_3SnX_{(3-Z)}X'_Z$

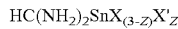  [Structural Formula 2-4]

$HC(NH_2)_2SnX_{(3-Z)}X'_Z$

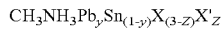  [Structural Formula 2-5]

$CH_3NH_3Pb_ySn_{(1-y)}X_{(3-Z)}X'_Z$

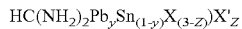  [Structural Formula 2-6]

$HC(NH_2)_2Pb_ySn_{(1-y)}X_{(3-Z)}X'_Z$

In Structural Formulae 2-1 to 2-6, X and X' are each independently a halogen ion, y is a real number of 0 to 1, and z is a real number of 0 to 3.

According to an exemplary embodiment of the present specification, the photoactive layer may further include a metal oxide.

According to an exemplary embodiment of the present specification, the solar cell further includes a substrate, and the anode or the cathode may be provided on the substrate.

According to an exemplary embodiment of the present specification, the solar cell may be a solar cell having a normal structure, in which the anode is provided on the substrate and the cathode is provided to face the anode. Specifically, in the case of a solar cell having a normal structure, the anode may be a conductive oxide, such as indium tin oxide (ITO) or indium zinc oxide (IZO). Further, in the case of a solar cell having a normal structure, the cathode may be a metal electrode including one or more selected from the group consisting of silver (Ag), aluminum (Al), platinum (Pt), tungsten (W), copper (Cu), molybdenum (Mo), gold (Au), nickel (Ni), and palladium (Pd).

In addition, according to an exemplary embodiment of the present specification, the solar cell may be a solar cell having an inverted structure, in which the cathode is provided on the substrate and the anode is provided to face the cathode. Specifically, in the case of a solar cell having an inverted structure, the cathode may be a conductive oxide, such as indium tin oxide (ITO) or indium zinc oxide (IZO). Further, in the case of a solar cell having a inverted structure, the anode may be a metal electrode including one or more selected from the group consisting of silver (Ag), aluminum (Al), platinum (Pt), tungsten (W), copper (Cu), molybdenum (Mo), gold (Au), nickel (Ni), and palladium (Pd).

The normal structure and the inverted structure may have the same meaning as a normal structure and an inverted structure in a general organic solar cell.

According to an exemplary embodiment of the present specification, the normal structure or the inverted structure may be determined depending on the work function of an electrode provided on a substrate and the work function of a metal electrode provided to face the electrode. Specifically, a conductive oxide layer such as ITO may be an anode or a cathode when the work function is controlled through a post-treatment process, and the like.

According to an exemplary embodiment of the present specification, the solar cell may further include one or more layers selected from the group consisting of a hole injection layer, a hole transporting layer, an electron blocking layer, an electron transporting layer, and an electron injection layer between the anode and the cathode.

According to an exemplary embodiment of the present specification, the solar cell may be manufactured by using a deposition process. Specifically, according to an exemplary embodiment of the present specification, there is an advantage in that the solar cell may be easily manufactured through one process because all the respective layers provided on a substrate may be formed by using the deposition process.

MODE FOR INVENTION

Hereinafter, the present specification will be described in detail with reference to the Examples for specifically describing the present specification. However, the Examples according to the present specification may be modified in various forms, and it is not interpreted that the scope of the present specification is not limited to the Examples described below. The Examples of the present specification are provided for more completely describing the present specification to the person with ordinary skill in the art.

Example 1

A glass substrate coated with ITO was washed and then treated with UV-$O_3$ for 30 minutes to prepare a substrate on which ITO was formed. And then, a first organic material layer (30 nm) composed of the compound represented by Chemical Formula 1-1 and a second organic material layer (20 nm) composed of N,N'-Di(1-naphthyl)-N,N'-diphenyl-(1,1'-biphenyl)-4,4'-diamine (NPB) were sequentially formed on the ITO through a deposition process.

And then, the deposition rate of $PbI_2$ was fixed to 0.1 nm/sec, the temperature of $CH_3NH_3I$ (MAI; methylammonium iodide) was slowly increased (to 130° C.), and then deposition was performed under a chamber atmosphere of $7\times10^{-5}$ to $1\times10^{-4}$ torr to form a photoactive layer composed of a compound having a perovskite structure with a thickness of 160 nm based on a $PbI_2$ thickness sensor.

FIG. 3 illustrates light absorption according to a wavelength of a photoactive layer formed as in Example 1 and an exterior photograph of a device manufactured according to Example 1. Specifically, FIG. 3 compares the degree of light absorption of a photoactive layer formed only of $PbI_2$ and a photoactive layer composed of a compound having a perovskite structure.

According to FIG. 3, it can be confirmed that the photoactive layer manufactured as in Example 1 has an excellent light absorption degree. That is, it can be seen that even though a compound having a perovskite structure is formed on an organic material layer through a deposition process, excellent light absorption capability is exhibited.

Further, FIG. 4 illustrates a scanning electron microscope (SEM) image of the surface of the photoactive layer manufactured as in Example 1. According to FIG. 4, it can be seen that even though a compound having a perovskite structure is formed on an organic material layer through a deposition process, the compound is uniformly formed without a defective region such as pinholes.

Example 2-1

A glass substrate coated with ITO was washed and then treated with UV-$O_3$ for 30 minutes to prepare a substrate on which ITO was formed. And then, a first organic material layer (30 nm) composed of the compound represented by Chemical Formula 1-1 and a second organic material layer (20 nm) composed of N,N'-Di(1-naphthyl)-N,N'-diphenyl-(1,1'-biphenyl)-4,4'-diamine (NPB) were sequentially formed on the ITO through a deposition process.

And then, the deposition rate of $PbI_2$ was fixed to 0.1 nm/sec, the temperature of $CH_3NH_3I$ (MAI; methylammonium iodide) was slowly increased (to 130° C.), and then deposition was performed under a chamber atmosphere of $7\times10^{-5}$ to $1\times10^{-4}$ torr to form a photoactive layer composed of a compound having a perovskite structure with a thickness of 160 nm based on a $PbI_2$ thickness sensor.

Furthermore, a solar cell having a normal structure was manufactured by depositing $C_{60}$ (90 nm), bathocuproine (BCP) (8 nm), and Al (100 nm) on the photoactive layer.

Comparative Example 1

A solar cell having a normal structure was manufactured in the same method as in Example 2-1, except that a second organic material layer was not formed.

FIG. 5 illustrates the results of measuring the voltage-current density of a solar cell manufactured according to Example 2-1 and a solar cell manufactured according to Comparative Example 1. In FIG. 5, an area on which light was made incident was limited by using a cover plate on which circular holes having a diameter of 5 mm were perforated, and then the performance of the solar cell was tested.

According to the results of FIG. 5, it can be seen that the performance of the solar cell of Comparative Example 1, in which the second organic material layer is not provided, significantly deteriorates, and it can be confirmed that the second organic material layer serves to smoothly recombine the solar cell by blocking movement of electrons formed in the photoactive layer.

Example 2-2

A solar cell was manufactured in the same manner as in Example 2-1, except that a photoactive layer composed of a compound having a perovskite structure was formed to have a thickness of 390 nm.

For the performance of the solar cell according to Example 2-2, the maximum open-circuit voltage was 1.05 V, the maximum short-circuit current was 19.3 mA/cm$^2$, the fill factor (FF) was 70%, and the maximum energy conversion efficiency (PCE) was 14.1%.

FIG. 6 illustrates the results of measuring the voltage-current density of a solar cell manufactured according to Example 2-2. In FIG. 6, an area on which light was made incident was limited by using a cover plate on which circular holes having a diameter of 5 mm were perforated, and then the performance of the solar cell was tested.

FIG. 7 illustrates a scanning electron microscope (SEM) image of the cross-section of the solar cell in Example 2-2. According to FIG. 7, it can be confirmed that crystals of the compound having a perovskite structure, which forms a photoactive layer, are uniformly formed without a short-circuit region. In FIG. 7, the numeral 101 means the compound represented by Chemical Formula 1-1.

Example 2-3

A solar cell having a normal structure was manufactured in the same manner as in Example 2-1, except that the first organic material layer, the second organic material layer, the first organic material layer, and the second organic material layer were sequentially deposited on the ITO.

FIG. 8 illustrates the results of measuring the voltage-current density of a solar cell manufactured according to Example 2-3. In FIG. 8, an area on which light was made incident was limited by using a cover plate on which circular holes having a diameter of 5 mm were perforated, and then the performance of the solar cell was tested.

For the performance of the solar cell according to Example 2-3, the maximum open-circuit voltage was 1.06 V, the maximum short-circuit current was 21.5 mA/cm$^2$, the fill factor (FF) was 59.5%, and the maximum energy conversion efficiency (PCE) was 13.4%.

Example 2-4

A glass substrate coated with ITO was washed to prepare a substrate on which ITO was formed (UV-$O_3$ treatment was not performed). And then, $C_{60}$ (10 nm) and $C_{60}$ (20 nm), which included 20 wt % of an n-type dopant, were deposited on the ITO, the deposition rate of $PbI_2$ was fixed to 0.1 nm/sec, the temperature of $CH_3NH_3I$ (MAI; methylammonium iodide) was slowly increased (to 130° C.), and then deposition was performed under a chamber atmosphere of $7\times10^{-5}$ to $1\times10^{-4}$ torr to form a photoactive layer composed of a compound having a perovskite structure with a thickness of 160 nm based on a $PbI_2$ thickness sensor.

A solar cell having an inverted structure was manufactured by depositing a second organic material layer (20 nm) composed of N,N'-Di(1-naphthyl)-N,N'-diphenyl-(1,1'-biphenyl)-4,4'-diamine (NPB) and a first organic material layer (30 nm) composed of the compound represented by Chemical Formula 1-1 on the photoactive layer, and then depositing Al (100 nm) thereon.

FIG. 9 illustrates the results of measuring the voltage-current density of a solar cell manufactured according to Example 2-4. In FIG. 9, an area on which light was made incident was limited by using a cover plate on which circular holes having a diameter of 5 mm were perforated, and then the performance of the solar cell was tested.

For the performance of the solar cell according to Example 2-4, the maximum open-circuit voltage was 1.03 V, the maximum short-circuit current was 17.4 mA/cm$^2$, the fill factor (FF) was 62%, and the maximum energy conversion efficiency (PCE) was 11.1%.

EXPLANATION OF REFERENCE NUMERALS AND SYMBOLS

100: Anode
200: Cathode
300: Photoactive layer
410, 420: First organic material layer
510, 520: Second organic material layer

The invention claimed is:

1. A solar cell comprising:
an anode;
a cathode provided to face the anode; and
a photoactive layer comprising a compound having a perovskite structure provided between the anode and the cathode,
wherein one layer of a first organic material, one layer of a second organic material, an other layer of the first organic material, and an other layer of the second organic material are sequentially provided between the anode and the photoactive layer,
the first organic material comprises a compound of the following Chemical Formula 1, and
the second organic material comprises a hole transporting material having a HOMO energy level of −5 eV or less:

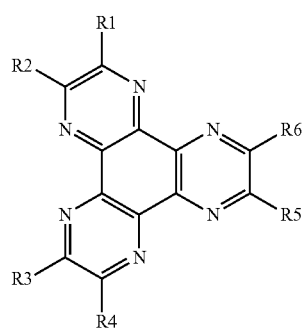

[Chemical Formula 1]

wherein in Chemical Formula 1:
R1 to R6 are each independently selected from the group consisting of hydrogen; a halogen group; a nitrile group; a nitro group; a sulfonyl group; a sulfoxide group; a sulfonamide group; a sulfonate group; a trifluoromethyl group; an ester group; an amide group; a substituted or unsubstituted straight- or branch-chained C1 to C12 alkoxy group; a substituted or unsubstituted straight- or branch-chained C1 to C12 alkyl group; substituted or unsubstituted straight- or branch-chained C2 to C12 alkenyl group; a substituted or unsubstituted aromatic or non-aromatic heterocyclic group; a substituted or unsubstituted aryl group; a substituted or unsubstituted mono- or di-arylamine group; and a substituted or unsubstituted aralkylamine group.

2. The solar cell of claim 1, wherein any one of the first organic material layers is provided to be directly brought into contact with the anode.

3. The solar cell of claim 1, wherein any one of the second organic material layers is provided to be directly brought into contact with the photoactive layer.

4. The solar cell of claim 1, wherein a difference between a LUMO energy level of the compound of Chemical Formula 1 and a HOMO energy level of the hole transporting material is 0.5 eV or less.

5. The solar cell of claim 1, wherein any one of the second organic material layers further comprises a material having a work function of 4.5 eV or less.

6. The solar cell of claim 1, wherein each of the first organic material layers has a thickness of 1 nm to 100 nm.

7. The solar cell of claim 1, wherein each of the second organic material layers has a thickness of 5 nm to 100 nm.

8. The solar cell of claim 1, wherein the compound having a perovskite structure satisfies the following Structural Formula 1-1:

$$AB_{(1-y)}B'_y X_{(3-z)} X'_z$$ [Structural Formula 1-1]

wherein:
A is a substituted or unsubstituted monovalent nitrogen ion, a substituted or unsubstituted monovalent carbon ion, and an alkali metal ion or alkaline earth metal ion,
B and B' are each independently a positive ion of a transition metal, and
X and X' are each independently a negative ion of an element selected from the group selected as Groups XVI and XVII, 0≤y≤1, and 0≤z≤3.

9. The solar cell of claim 8, wherein A is a monovalent ion of the following Chemical Formula 2-1:

$$[A'_p A''_{(1-p)}]^+$$ [Chemical Formula 2-1]

wherein:
A' and A" are each independently Li⁺, Na⁺, K⁺, Rb⁺, or Cs⁺, and
0≤p≤1.

10. The solar cell of claim 8, wherein A is a monovalent ion of Chemical Formula 2-2:

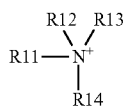

[Chemical Formula 2-2]

wherein in Chemical Formula 2-2:
R11 is a substituted or unsubstituted alkyl group having 1 to 20 carbon atoms, a substituted or unsubstituted cycloalkyl group having 3 to 20 carbon atoms, or a substituted or unsubstituted aryl group having 6 to 20 carbon atoms, and
R12 to R14 are each independently hydrogen, a substituted or unsubstituted alkyl group having 1 to 20 carbon atoms, a substituted or unsubstituted cycloalkyl group having 3 to 20 carbon atoms, or a substituted or unsubstituted aryl group having 6 to 20 carbon atoms.

11. The solar cell of claim 8, wherein A is a monovalent ion of Chemical Formula 2-3:

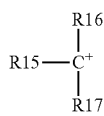

[Chemical Formula 2-3]

wherein in Chemical Formula 2-3:
R15, R16 and R17 are a substituted or unsubstituted alkyl group having 1 to 20 carbon atoms, a substituted or unsubstituted cycloalkyl group having 3 to 20 carbon atoms, a substituted or unsubstituted aryl group having 6 to 20 carbon atoms, or NR'R", and R' and R" are each independently hydrogen, a substituted or unsubstituted alkyl group having 1 to 20 carbon atoms, or a substituted or unsubstituted alkoxy group having 1 to 20 carbon atoms.

12. The solar cell of claim 1, wherein the compound having a perovskite structure satisfies any one of the following Chemical Formulae 2-1 to 2-6:

$$CH_3NH_3PbX_{(3-z)}X'_z \qquad \text{[Structural Formula 2-1]}$$

$$HC(NH_2)_2PbX_{(3-z)}X'_z \qquad \text{[Structural Formula 2-2]}$$

$$CH_3NH_3SnX_{(3-z)}X'_z \qquad \text{[Structural Formula 2-3]}$$

$$HC(NH_2)_2SnX_{(3-z)}X'_z \qquad \text{[Structural Formula 2-4]}$$

$$CH_3NH_3Pb_ySn_{(1-y)}X_{(3-z)}X'_z \qquad \text{[Structural Formula 2-5]}$$

$$HC(NH_2)_2Pb_ySn_{(1-y)}X_{(3-z)}X'_z \qquad \text{[Structural Formula 2-6]}$$

in Chemical Formulae 2-1 to 2-6,

X and X' are each independently a halogen ion, y is a real number of 0 to 1, and z is a real number of 0 to 3.

13. The solar cell of claim 1, wherein the photoactive layer further comprises a metal compound.

14. The solar cell of claim 1, further comprising:
a substrate,
wherein the anode or the cathode is provided on the substrate.

* * * * *